(12) United States Patent
Ouyang et al.

(10) Patent No.: US 11,151,439 B2
(45) Date of Patent: Oct. 19, 2021

(54) COMPUTING IN-MEMORY SYSTEM AND METHOD BASED ON SKYRMION RACETRACK MEMORY

(71) Applicants: HEFEI INNOVATION RESEARCH INSTITUTE, BEIHANG UNIVERSITY, Anhui (CN); BEIHANG UNIVERSITY, Beijing (CN)

(72) Inventors: Peng Ouyang, Beijing (CN); Yu Pan, Beijing (CN); Youguang Zhang, Beijing (CN); Weisheng Zhao, Beijing (CN)

(73) Assignees: HEFEI INNOVATION RESEARCH INSTITUTE, BEIHANG UNIVERSITY, Anhui (CN); BEIHANG UNIVERSITY, Beijing (CN)

( * ) Notice: Subject to any disclaimer, the term of this patent is extended or adjusted under 35 U.S.C. 154(b) by 0 days.

(21) Appl. No.: 17/043,677

(22) PCT Filed: Apr. 25, 2019

(86) PCT No.: PCT/CN2019/084297
§ 371 (c)(1),
(2) Date: Sep. 30, 2020

(87) PCT Pub. No.: WO2020/177202
PCT Pub. Date: Sep. 10, 2020

(65) Prior Publication Data
US 2021/0019596 A1      Jan. 21, 2021

(30) Foreign Application Priority Data
Mar. 7, 2019 (CN) .......................... 201910173095.X

(51) Int. Cl.
*G06N 3/04* (2006.01)
*G11C 11/16* (2006.01)

(52) U.S. Cl.
CPC .............. *G06N 3/04* (2013.01); *G11C 11/161* (2013.01); *G11C 11/1655* (2013.01);
(Continued)

(58) Field of Classification Search
CPC ....................................................... G06N 3/04
See application file for complete search history.

(56) References Cited

U.S. PATENT DOCUMENTS 10,505,095 B2* 12/2019 Schneider ............ G06N 3/0635
10,635,970 B2*  4/2020 Frank ..................... G06N 3/084
(Continued)

FOREIGN PATENT DOCUMENTS

CN      104134460       11/2014
CN      106971372       7/2017

OTHER PUBLICATIONS

"International Search Report (Form PCT/ISA/210) of PCT/CN2019/084297," dated Dec. 4, 2019, pp. 1-4.

*Primary Examiner* — Douglas King
(74) *Attorney, Agent, or Firm* — JCIPRNET

(57) ABSTRACT

A computing in-memory system and computing in-memory method based on a skyrmion race memory are provided. The system comprises a circuit architecture of SRM-CIM. The circuit architecture of the SRM-CIM comprises a row decoder, a column decoder, a voltage-driven, a storage array, a modified sensor circuit, a counter Bit-counter and a mode controller. The voltage-driven includes two NMOSs, and the two NMOSs are respectively connected with a selector MUX. The modified sensor circuit compares the resistance between a first node to a second node and a third node to a fourth node by using a pre-charge sense amplifier. The
(Continued)

storage array is composed of the skyrmion racetrack memories. The computing in-memory architecture is designed by utilizing the skyrmion racetrack memory, so that storage is realized in the memory, and computing operation can be carried out in the memory.

12 Claims, 6 Drawing Sheets

(52) U.S. Cl.
CPC ...... *G11C 11/1657* (2013.01); *G11C 11/1673* (2013.01); *G11C 11/1675* (2013.01)

(56) References Cited

U.S. PATENT DOCUMENTS

| | | | |
|---|---|---|---|
| 10,777,247 B1* | 9/2020 | Sun | H01L 43/02 |
| 2010/0172171 A1* | 7/2010 | Azuma | H01L 27/101 |
| | | | 365/148 |
| 2018/0335973 A1* | 11/2018 | Sato | G11C 11/16 |
| 2019/0035449 A1 | 1/2019 | Saida et al. | |
| 2019/0340508 A1* | 11/2019 | Liu | G05B 13/027 |

* cited by examiner

COMPUTING IN-MEMORY SYSTEM AND METHOD BASED ON SKYRMION RACETRACK MEMORY

CROSS-REFERENCE TO RELATED APPLICATION

This application is a 371 of international application of PCT application serial no. PCT/CN2019/084297, filed on Apr. 25, 2019, which claims the priority benefit of China application no. 201910173095.X, filed on Mar. 7, 2019. The entirety of each of the above mentioned patent applications is hereby incorporated by reference herein and made a part of this specification.

BACKGROUND

Field of the Disclosure

The disclosure relates to the field of computer technology, in particular to a computing in-memory system and method based on skyrmion racetrack memory.

Description of Related Art

Convolutional neural networks can be applied to face recognition, voice recognition, etc., which have been commonly applied in the field of Internet of Things. However, the application of convolutional neural networks requires a large amount of data to perform energy-intensive calculations such as multiplication, which is in contradiction with the requirement of artificial intelligence devices for ultra-low power consumption. Binary convolutional neural network (BCNN) converts the input and weights into binary values ("1" or "−1"), thereby greatly reducing computational data and reducing power consumption. Moreover, the reduction in computational data does not cause much loss of accuracy. In the meantime, the complex multiplication operation in the binary convolutional operation can be replaced with the AND operation, which is easier to implement in the circuit and requires less energy consumption.

However, data transmission between the memory unit and the processing unit still consumes a lot of calculation resources. The method of computing in-memory adopted in prior art solves the problem of data transmission. However, these designs are based on volatile memory SRAM, and due to the limitations of SRAM itself (such as large area, large leakage current, etc.), the performance of these designs is still limited.

Non-volatile memories, such as resistive random access memory (RRAM), spin magnetic moment magnetic random access memory (SOT-MRAM), domain wall memory (DWM), and skyrmions racetrack memory (SRM), with their unique properties, such as nearly zero-static energy consumption and high integration, are very likely to replace SRAM. Among these non-volatile memories, extensive research has been conducted on DWM due to its high integration and low power consumption. In recent years, SRM has attracted much attention due to its small size (up to several nanometers), and its displacement current ($10^6$ A/m$^2$) is smaller than DWM ($10^{11}$-$10^{12}$ A/m$^2$).

SUMMARY OF THE DISCLOSURE

Technical Problem

Data transmission between the memory unit and the processing unit still consumes a lot of calculation resources. The method of computing in-memory adopted in prior art solves the problem of data transmission. However, these designs are based on volatile memory SRAM, and due to the limitations of SRAM itself (such as large area, large leakage current, etc.), the performance of these designs is still limited.

Technical Solution

The disclosure provides a computing in-memory system and method based on skyrmion racetrack memory, which can solve the problem of sparsity of a binary convolutional neural network and reduce power consumption of calculation.

In order to achieve the above purpose, the disclosure adopts the following technical solutions.

A computing in-memory system based on skyrmion racetrack memory includes a circuit architecture of SRM-CIM. The circuit architecture of the SRM-CIM includes a row decoder Row Decoder, a column decoder Column Decoder, a voltage-driven Voltage Supplier, a storage array, a sensor circuit MSC, a counter Bit-counter and a mode controller MC.

Specifically, the voltage-driven Voltage Supplier includes two NMOSs, and the drains of the two NMOS are respectively connected with a voltage source that supplies voltage to the write operation and read operation, the source is grounded, and the gate is connected to a 3-to-1 selector MUX, and further includes a wire and two NMOSs and are connected to a 3-to-1 selector in parallel, representing that the voltage of bit line BL required for read operation, AND operation and XOR operation is 0. Under the control of the control signal CS sent by the mode controller MC, the selector selects the corresponding NMOS or wire, and supplies the driving voltage according to the operating mode.

The sensor circuit MSC compares the resistance between nodes ab and nodes cd by using a pre-charge sense amplifier PCSA.

The nodes ab are respectively connected to the bit line BL and the source line SL of the circuit, and a reference resistor is connected between the nodes cd.

The reference resistor requires different resistances in different operating modes. Specifically, the three NMOSs are respectively connected in series as MTJ Rrefr that supplies resistance for the read operation, MTJ Rrefx that supplies resistance for the XOR operation and MTJ Rrefa that supplies resistance for the AND operation. Then the drain is connected to node c in parallel, the source is connected to node d, and the gate is connected to a 3-to-1 selector MUX. The selector is controlled by the control signal CS to select the corresponding NMOS, and select the corresponding reference resistor according to the operating mode.

The storage array is composed of a skyrmion racetrack memory.

Furthermore, the pre-charge sense amplifier PCSA includes four PMOSs and two NMOSs. If the resistance Rab between nodes ab is greater than the resistance Rcd between nodes cd, Qm outputs 0 and $\overline{Qm}$ outputs 1; on the contrary, if Rab is less than Rcd, Qm outputs 1 and $\overline{Qm}$ outputs 0.

Further, the circuit architecture of the SRM-CIM is a nano racetrack, including a ferromagnetic layer, a heavy metal layer, and a substrate layer.

With MTJ being written in series to the bit line BL and the source line SL through one NMOS on the racetrack, and the gate of NMOS being connected to the write word line WWL, which is a write port, so as to control the generation of skyrmion.

With MTJ being read in series to the bit line BL and the source line SL through one NMOS on the racetrack, and the gate of NMOS being connected to the read word line RWL, which is a read port, so as to control the inspection of skyrmion. The different resistances displayed on the MTJ reading head represent data "1" and "0" respectively.

With NMOS being connected in series to the bit line BL and the source line SL on both sides on the racetrack, and the gate of two NMOSs being connected to the shift word line SWL, which is a shift port, so as to control the movement of skyrmion.

Further, the storage array includes a vertical racetrack group VRG and a horizontal racetrack group HRG, and the vertical racetrack group VRG and the horizontal racetrack group HRG are respectively composed of a skyrmion racetrack memory.

In the vertical racetrack group VRG, the skyrmion racetrack memory is connected vertically.

In the horizontal racetrack group HRG, the skyrmion racetrack memory is connected horizontally.

On the other hand, the disclosure also discloses a computing in-memory method based on skyrmion racetrack memory, which adopts the above-mentioned computing in-memory system based on skyrmion racetrack memory and includes a convolution process of a binary convolutional neural network. The convolution process specifically includes the following steps.

An input is a m×m matrix and a weight is a n×n matrix, wherein n is less than m. The weight matrix is scanned on the input matrix, and the corresponding weight vector and the input vector are subjected to convolution calculation.

A formula of the convolution calculation formula is expressed as:

$$I \& W = \text{Bit-count}(I(B) \& W(B))$$

Specifically, I and W are the input and weight vectors, respectively, and I(B) and W(B) are the binary digits of each bit in the input and the weight, respectively.

Moreover, the method further includes a shift method for the convolution process of a binary convolutional neural network, which specifically includes:

If the weight of n×n is scanned on the input of m×m, the step size is 1, then

S1. The weight data and input data are stored in the storage array in the original order, the input is stored in the horizontal racetrack group HRG, and the weight is stored in the vertical racetrack group VRG.

S2. The weight and the corresponding input are subjected to convolution calculation.

S3. The weight is moved to the right by 1 unit of length, and is subjected to the convolution calculation along with the corresponding input.

S4. Step S3 is repeated for $$\left[\frac{m}{l}\right] - 1$$

times.

S5. The input is moved upward by 1 unit of length, and the weight is moved to the initial position on the left.

S6. Steps S2, S3 and S4 are repeated.

S7. Steps S5 and S6 are repeated for $$\left[\frac{m}{l}\right] - 2$$

times.

Moreover, the method further includes the step of writing a vector in the convolution process of a binary convolutional neural network.

WWL is enabled, and a positive voltage is set between BL and SL, "1" is written on the racetrack of the writing head. If data "0" is to be written, no operation is required.

SWLs are enabled, and a positive voltage is set between BL and SL, the data just written is moved down to the next unit, and the next data is continuously written in the writing head.

Moreover, the method includes a read operation.

If the data stored in the reading head is 1, the resistance of the reading head is represented by $R_1$; otherwise, the data stored in the reading head is 0, and the resistance of the reading head is represented by $R_0$; the reference resistor is represented by Rrefr, $R_1$>Rrefr>$R_0$.

When WL is enabled and Vread is 0 V, data will be read from "0" based on the MSC.

Moreover, the method further includes an XOR operation.

In the XOR operation, the relationship between the reference resistor Rrefx and $R_{ij}$ is $R_{11}$>$R_{10}$=$R_{01}$>Rrefx>$R_{00}$.

Two steps are required to obtain the XOR operation result.

In the first step, the MSC performs an AND operation, and transmits the output signal "0" to the mode controller MC.

In the second step, the MC outputs a control signal CS according to the signal "0" to determine whether to enable Rrefx, and then use PCSA to obtain the XOR result.

If (O) outputs "1" in step 1, it means that the data to be accessed is "1", and MC does not enable any reference resistor to disconnect nodes c and d, and therefore (O) outputs "0" in step 2. Otherwise, if (O) outputs "0" in step 1, MC will enable reference resistor Rrefx, and then (O) will output the XOR results of other conditions.

Advantageous Effect

Based on the above technical solutions, it can be obtained that the computing in-memory architecture of the disclosure is designed by utilizing the skyrmion racetrack memory, so that storage is realized in the memory, and computing operation can be carried out in the memory. Binary convolution calculation is effectively supported in the disclosure, the shift characteristic of the SRM is fully utilized, data memory access redundancy is reduced, and the problem of sparsity of BCNN is solved, thereby reducing the calculation burden, and significantly reducing power consumption.

In the meantime, the disclosure provides a computing in-memory architecture based on skyrmion racetrack memory (SRM-CIM) with ultra-low power consumption for convolutional neural networks that are widely applied in the field of Internet of Things. The architecture can simultaneously perform storage operation and calculation operation (AND operation and XOR operation) in the memory. The disclosure can realize that the 2×2 kernel needs only 26.751 nJ of energy to complete a convolution scanning process on a 64×64 input, and the execution time is only 72.641 us. In the case where a typical binary convolutional neural network ratio is, for example, XNOR-Net, when the disclosure is applied to the convolutional layer, the energy consumed is reduced by 98.7% compared with the equivalent based on RRAM.

DESCRIPTION OF EMBODIMENTS

Most Preferable Embodiment of the Disclosure

In order to make the purpose, technical solutions, and advantages of the disclosure clearer, the following further describes the disclosure in detail with reference to the accompanying drawings and embodiments. Obviously, the described embodiments are part of the embodiments of the disclosure, not all of the embodiments.

This embodiment utilizes the designed circuit structure and element shift strategy to complete the convolution calculation operation shown in FIG. 2, which is specifically as follows:

FIG. 4(a) is the overall architecture of SRM-CIM, which consists of a row decoder (Row Decoder), a column decoder (Column Decoder), a voltage-driven (Voltage Supplier), a storage array (VRG+HRG), an improved sensor circuit (MSC), a counter (Bit-counter) and a mode controller (MC).

Specifically, the voltage drive is shown in FIG. 4(b), which is formed by connecting two NMOSs and a selector. Under the control of the control signal CS sent by the mode controller MC, the selector selects the corresponding MOS tube or wire, and supplies different driving voltages according to different operating modes (write operation, shift operation, read operation, AND operation, XOR operation).

The improved sensor circuit (MSC) is shown in FIG. 4(c), which uses a pre-charged sense amplifier (PCSA) to compare the resistance between nodes ab and cd (stored data). The nodes ab are respectively connected to the bit line BL and the source line SL of the circuit, and a reference resistor is connected between nodes cd. According to different operation requirements (read operation, AND operation, XOR operation), it is necessary to connect reference resistors of different resistances between the nodes cd. In this embodiment, the structure within the dashed frame is provided. Under the control of the control signal CS, the selector selects the reference resistors Rrefr, Rrefa, and Rrefx required for the corresponding operation.

Figure 5:
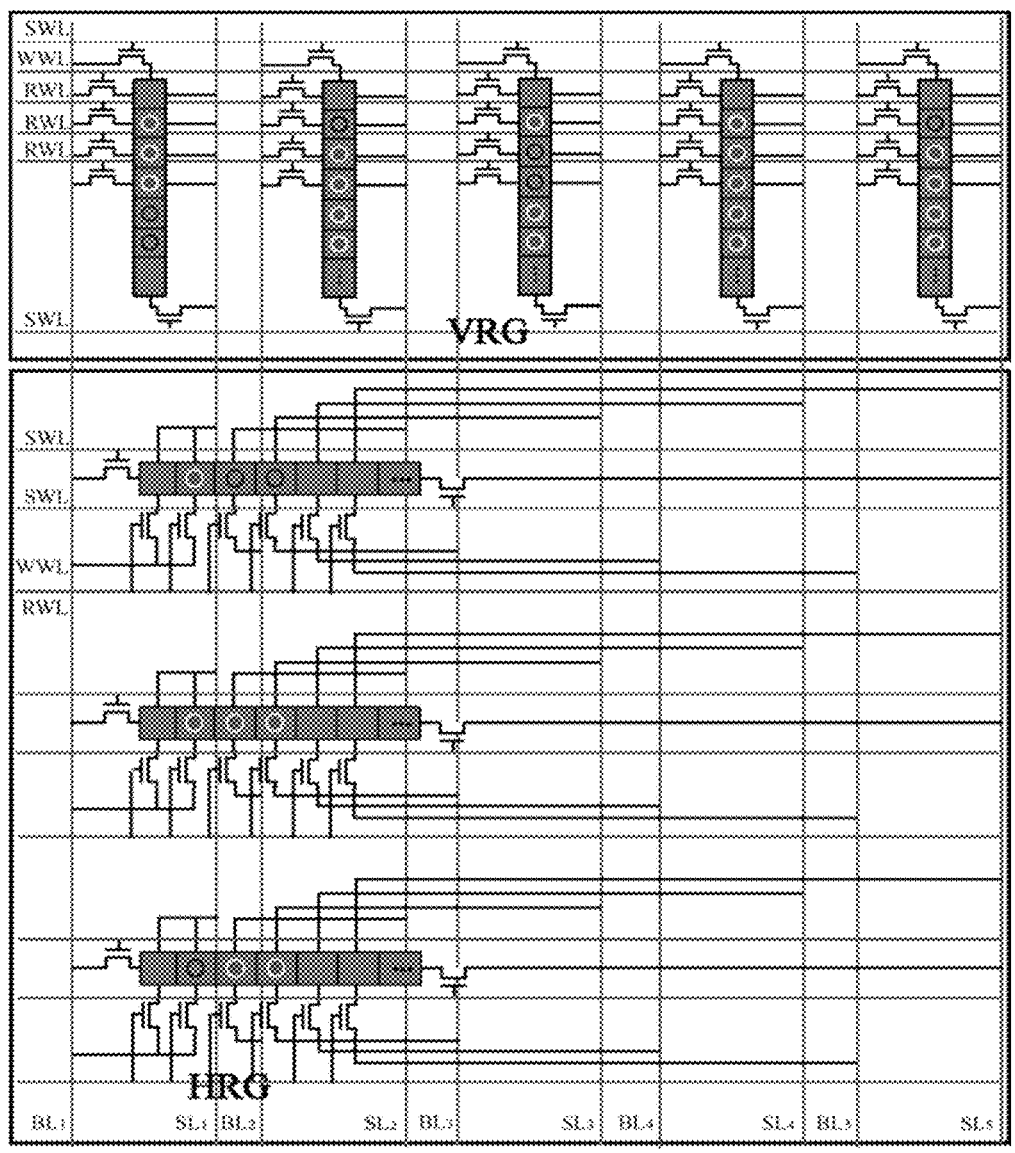
FIG. 5 is a schematic view of the structure of VRG and HRG according to an embodiment of the disclosure.
Figure 5:
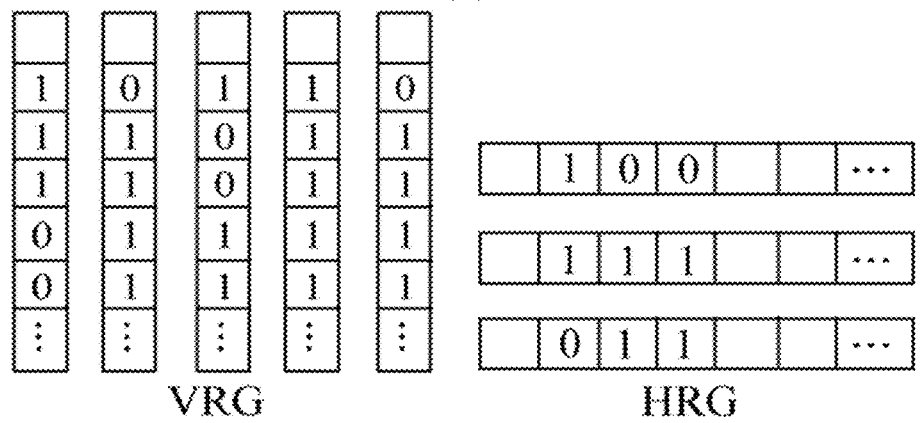

FIG. 5 shows a storage array. The storage array is composed of two parts: a vertical racetrack (VRG) and a horizontal racetrack (HRG). Inputs and weights are stored in VRG and HRG respectively.

The storage array VRG and the storage array HRG are composed of skyrmion racetrack memory. In VRG, skyrmion racetrack memory is connected vertically (the stored data can be moved in the vertical direction). In HRG, skyrmion racetrack memory is connected horizontally (the stored data can be moved in the horizontal direction).

First, the skyrmion racetrack memory that composes the storage arrays VRG and HRG is described below.

Figure 1:
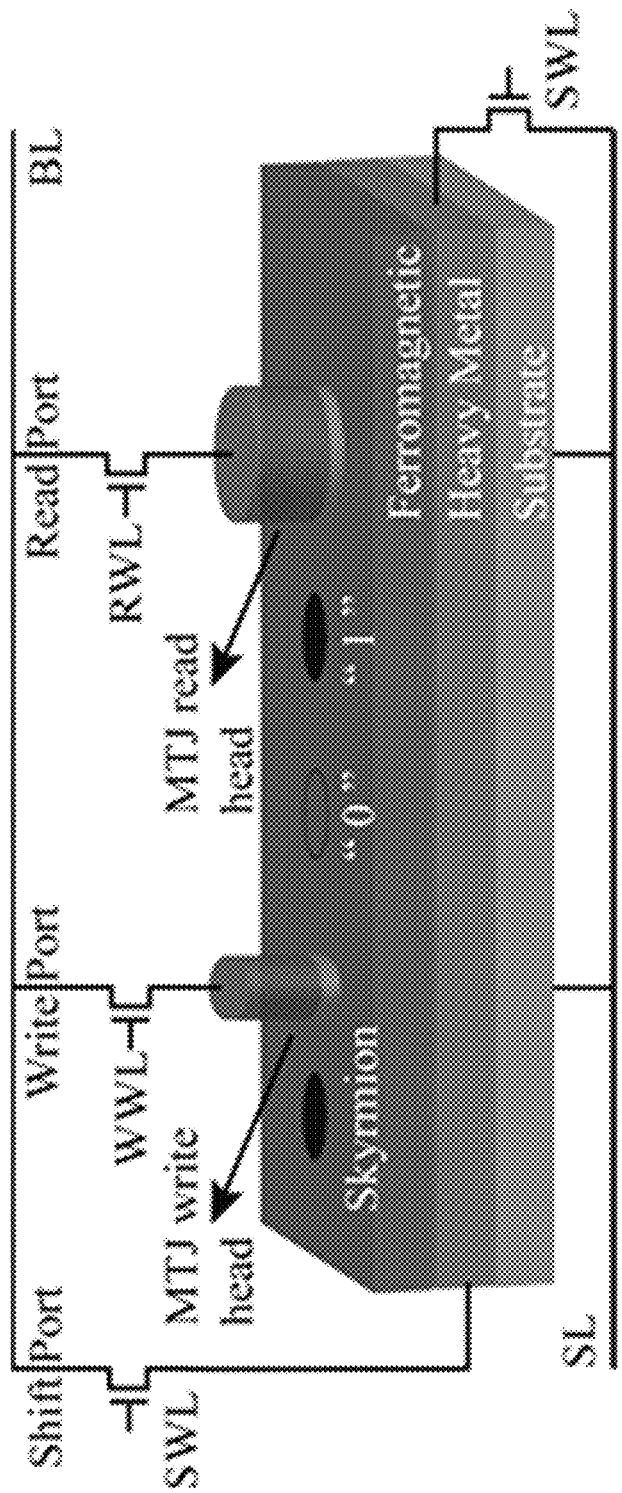
FIG. 1 is a schematic view showing the principle of skyrmion racetrack memory according to an embodiment of the disclosure.

Specifically, the storage of data is based on the skyrmion racetrack memory shown in FIG. 1 (VRG and HRG are composed of the skyrmion racetracks). The entire circuit is a nano racetrack, which consists of three layers: a ferromagnetic layer, a heavy metal layer and a substrate layer. Skyrmion (black solid circles) are chiral spin structures with stable spiral magnetic order under the background of uniform magnetization distribution. The binary data "1" (or "0") can be represented by the existence (or non-existence) of skyrmion on the racetrack. On the racetrack, with MTJ being written in series to the bit line BL and the source line SL through one NMOS, and the gate of NMOS being connected to the write word line WWL, which is a write port, so as to control the generation of skyrmion. On the racetrack, with MTJ being read in series to the bit line BL and the source line SL through one NMOS, and the gate of NMOS being connected to the read word line RWL, which is a read port, so as to control the inspection of skyrmion. The different resistances displayed on the MTJ reading head represent data "1" and "0" respectively. With NMOS being connected in series to the bit line BL and the source line SL on both sides on the racetrack, and the gate of two NMOSs being connected to the shift word line SWL, which is a shift port, so as to control the movement of skyrmion.

Secondly, the internal structure of the storage arrays VRG and HRG and the binary digits stored therein is described below.

FIG. 5a shows the internal structure of VRG and HRG, and FIG. 5b shows the corresponding binary data.

In FIG. 5a, a solid black circle indicates that there is a skyrmion with a data "1" on the racetrack, and a hollow circle with a black contour indicates that the data is "0".

The following describes the shift strategy for the binary image convolution process in the embodiment of the disclosure.

1. Introduction to Convolution Process

An input is a m×m matrix and a weight is a n×n matrix, wherein n is less than m. The weight matrix is scanned on the input matrix, and the corresponding weight vector and the input vector are subjected to convolution calculation.

Figure 2:
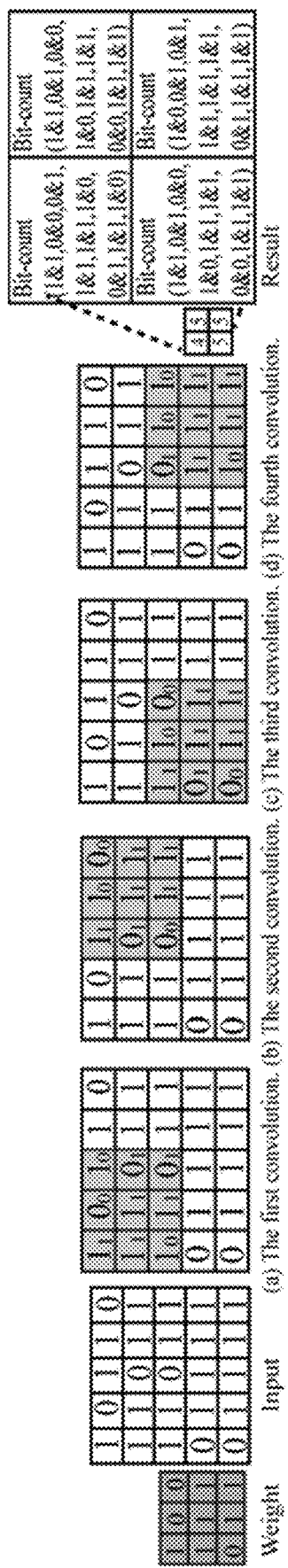
FIG. 2 is a schematic view of a convolution scanning process with a 3×3 weight on a 5×5 input according to an embodiment of the disclosure (the step size is 2).

Taking the convolution process shown in FIG. 2 as an example, a 3×3 weight (gray part) matrix is scanned on a 5×5 input matrix (white part). The whole process includes (a) (b) (c) (d) four convolution calculations. The corresponding result is a 2×2 matrix containing four elements, and the four elements are the results of the four convolution calculations. Each convolution calculation is carried out by performing an AND operation on the corresponding binary input and the corresponding bit of the binary weight, and then the results of the AND operations on each bit are accumulated. Each convolution calculation formula can be expressed as:

$$I\&W = \text{Bit-count}(I(B)\&W(B))$$

Specifically, I and W are the input and weight vectors, respectively, and I(B) and W(B) are the binary digits on each bit of the input and weight, respectively.

2. Shift Strategy of Convolution Process

If the weight of n×n is scanned on the input of m×m, the step size is 1.

1. The weights and inputs are written to HRG and VRG, respectively.

2. Convolution calculation is performed on weights and corresponding inputs.
3. The weight is moved to the right by 1 unit of length, and is subjected to convolution calculation along with the corresponding input.
4. Step 3 is repeated for $$\left[\frac{m}{l}\right] - 1$$

times.
5. The input is moved upward by 1 unit of length, and the weight is moved to the initial position on the left.
6. Steps 2, 3 and 4 are repeated.
7. Steps 5 and 6 are repeated for $$\left[\frac{m}{l}\right] - 2$$

times.

Figure 3:
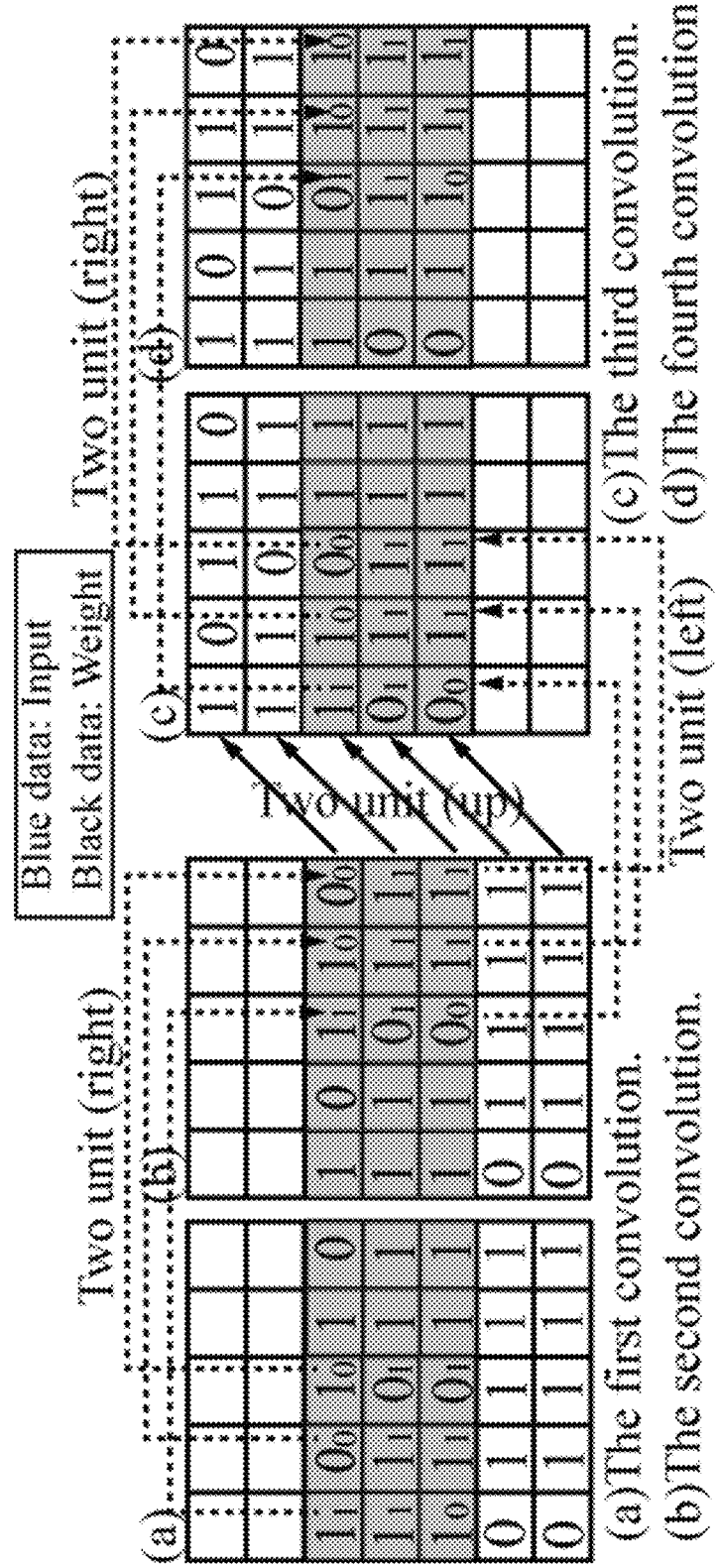
FIG. 3 is a schematic view showing a shift strategy for convolution calculation according to an embodiment of the disclosure.

Please refer to FIG. 3 for the specific shift strategy. It can be seen from FIG. 2 that the same weight vector is convolved with different blocks in different input matrices. The shift meta strategy in the embodiment of the disclosure may store the weight data and input data only once to complete the entire convolution scanning process, thereby avoiding redundancy of data storage. The process is shown in FIG. 3. Before the convolution process, the weight data and the input data are stored in the storage array in the original order; the input is stored in the HRG, and the weight is stored in the VRG. After completing the first convolution calculation, the weight data is moved to the right by two units of length (according to FIG. 2, the convolution scan step size is 2), and the second convolution calculation is performed. Then the input data is moved upward by two units of length; and the weight data is moved to the left by two units of length to complete the third convolution calculation. Finally, the weight is again shifted to the right by two units of length to prepare for the fourth convolution calculation.

3. The Convolution Process Shown in FIG. 2 is Completed.

3.1. The Input and Weight are (Stored) Written into the Circuit in Order.

WWL is enabled, and a positive voltage is set between BL and SL, "1" may be written on the racetrack of the writing head. If data "0" is to be written, no operation is required. SWLs are enabled, and a positive voltage is set between BL and SL, the data just written is moved down to the next unit, such that the next data can be continuously written in the writing head.

FIG. 5 shows the data corresponding to each storage unit. According to FIG. 5, the (1, 0, 0, 1, 1) vector in the input matrix should be written to the third racetrack in the VRG. According to the design, the order of writing data is opposite to the order of data, that is, the data is written in the order of (1, 1, 0, 0, 1). Take this as an example to introduce the steps of writing vector. First, WWL is enabled, and a positive voltage is set between BL and SL, "1" is written on the racetrack of the writing head. Then, SWLs are enabled, and a positive voltage is set between BL and SL, the data "1" is moved down to the next unit, such that the next data "1" can be written in the writing head. Because the next two data are both "0", there is no need to perform any processing, only the skyrmion chain is moved down by two units of length, that is, two "0"s are written. Finally, the skyrmion chain is moved down by 1 unit of length, and then the last data "1" is written on the writing head to complete the write operation of the vector (1, 0, 0, 1, 1). Based on the concept described above, all vectors of the input and weight matrix can be stored in parallel to the storage array.

3.1.1. Specific Steps of Write Operation

As shown in FIG. 3, when WWL is enabled, a positive voltage is applied between the bit line BL and the source line SL to generate a spin-polarized current. If this current is greater than the threshold current, a skyrmion structure representing logic data "1" will be generated after a period of time. On the contrary, if there is no skyrmion, it means that the logic data is "0".

3.1.2. Specific Implementation Steps of Element Shift Operation

When the SWLs on both sides of the racetrack are enabled, if a forward voltage is applied between BL and SL, a shift current will be generated in the racetrack. If the shift current is greater than the threshold current for shift, skyrmion is moved to the right at a certain speed. (If there is an appropriate negative current between BL and SL, skyrmion will be moved to the left.)

3.2. The Convolution Calculation Shown in FIG. 2(*a*) is Completed.

3.2.1. Implementation Steps of Convolution Calculation

Figure 6:
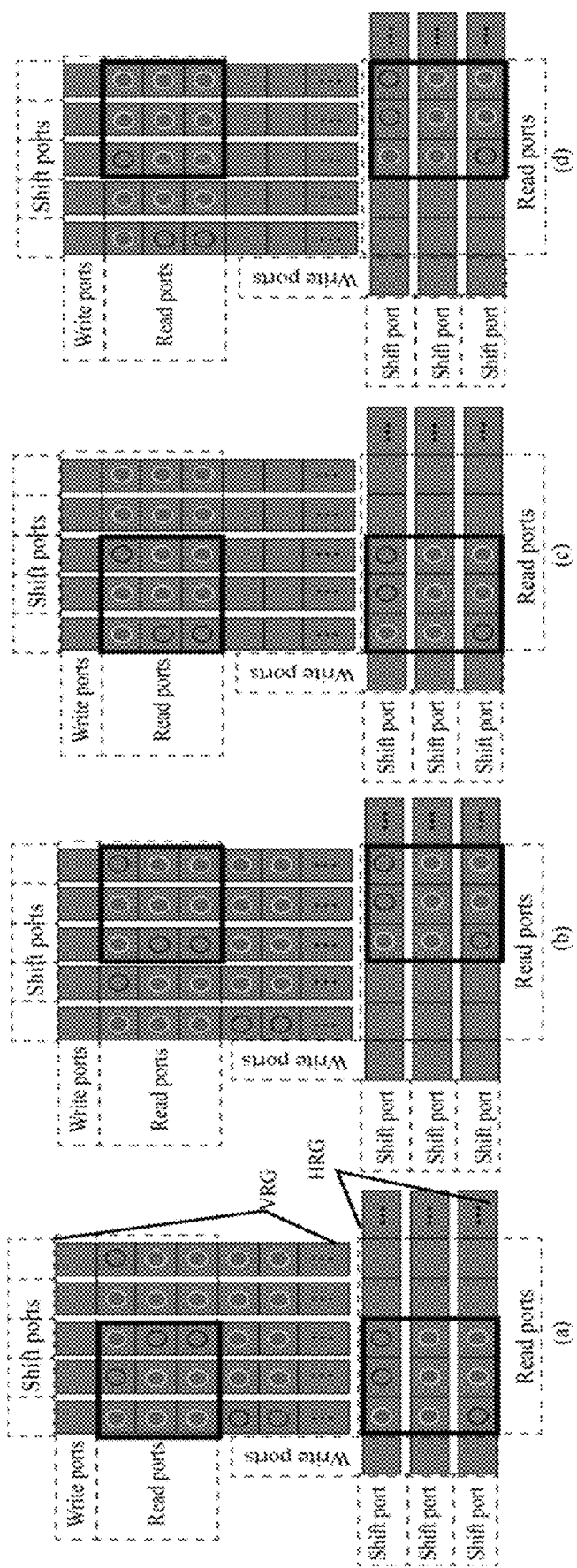
FIG. 6 is a schematic view of data storage and element shift in the scanning convolution process of this embodiment.

As shown in FIG. 6(*a*), the input data (1 0 1, 0 1 1, 1 0 0) and weight data (1 0 0, 1 1 1, 0 1 1) that are circled with black solid lines are the information to be accessed. The implementation of convolution calculation requires three steps. Step 1: An AND operation is performed between the input (1, 0, 1) of the first row of VRG and the weight (1, 0, 0) of the first row of HRG: 1&1, 0&0 and 1&0. Then the result is transmitted to the bit counter. In Steps 2 and 3, the same process in Step 1 is performed on the data stored in the second and third rows of VRG and HRG, respectively. Then the result of the first convolution calculation (a) is output through the counter.

3.2.2. Specific Implementation Steps of AND Operation

Figure 4:
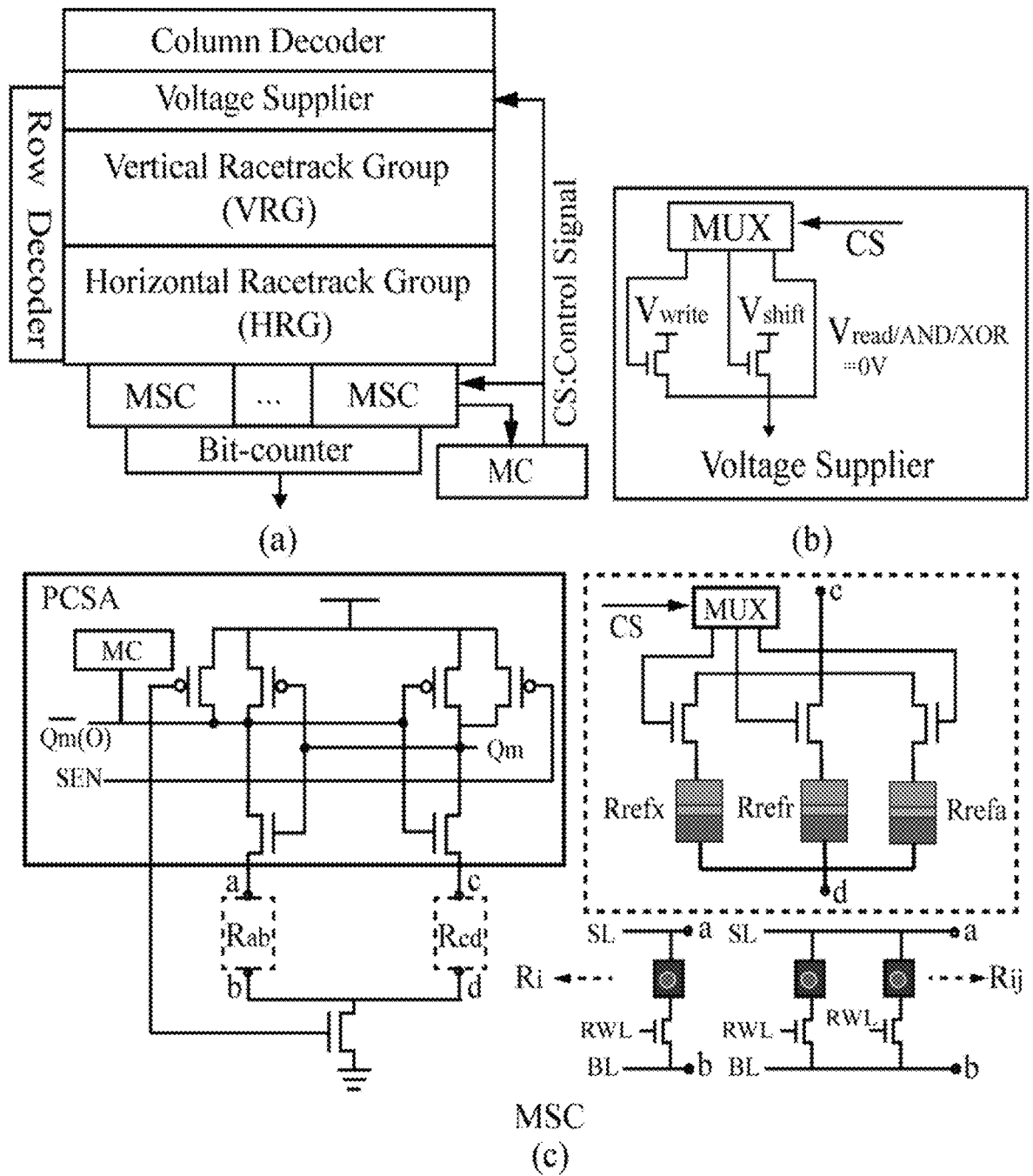
FIG. 4 is a schematic view of the architecture of SRM-CIM according to an embodiment of the disclosure.

The AND operation is required here, and the specific implementation steps are as follows. The structure and operation of the two cells to be processed are shown in FIG. 4(*c*), given by $R_{ij}$ (i and j are logic data "1" and "0" respectively). $R_{ij}$ is the resistance of $R_i$ connected in parallel with $R_j$ ($R_i$ and $R_j$ must be in the same column). It has four possible values $R_{11}$, $R_{10}$, $R_{01}$ and $R_{00}$, as shown in Table 1. Rrefa is the reference resistor between c and d, $R_{11} > Rrefa > R_{10} = R_{01} > R_{00}$. When the WLs of the two accessed units are enabled and V and is 0 V, the AND operation result will be output from (O) based on the MSC.

3.2.3. The Convolution Calculation as Shown in FIG. 2(*b*) is Completed.

The convolution calculation shown in FIG. 2(*b*) is completed. In FIG. 6(*b*), the shift port in HRG is enabled to shift the weight (1 0 0, 1 1 1, 0 1 1) to the right by two units of length. The input and weight required to perform the second convolution calculation in FIG. 1(*b*) are arranged in the same column. The black solid line surrounds the data to be accessed. After performing the three steps of the convolution calculation described in 3.2.1, the second convolution calculation (b) can be completed.

3.2.4. The Convolution Calculation Shown in FIGS. 2(*c*) and 2(*d*) is Completed.

In FIG. 6(*c*), by enabling SWLs in VRG, the input is moved upward by two units of length, so that the input to be accessed in the previous two convolution calculations (c) and (d) is moved to the reading head, and the weights are moved to the left to prepare for the third convolution calculation (c). After completing the convolution calculation (c), in FIG. 6(d), the weights are moved to the right like in FIG. 6(b), and the final convolution calculation (d) will be realized. Therefore, the disclosure and the mapping strategy can execute the convolution process in FIG. 2 without memory access redundancy and realize scanning convolution, and calculation energy can be significantly reduced.

4. The Embodiments of the Disclosure can Implement other Operations.

The above-described write operation, shift operation, and AND operation are not limited to convolution calculations. In addition, this design can also implement XOR operation and read operation commonly used in memory.

4.1. Specific Steps of Read Operation

If the data stored in the reading head is 1, the resistance of the reading head is represented by $R_1$; otherwise, the data stored in the reading head is 0, and the resistance of the reading head is represented by $R_0$. The reference resistor is represented by Rrefr. $R_1$>Rrefr>$R_0$, when WL is enabled and Vread is 0 V, data will be read from (O) based on MSC.

Table 1 shows the parameters of read operation and XOR operation. "pre" and "abs" represent the presence and absence of skyrmion on the racetrack, and represent the logic data "1" and "0" respectively. The structure of the cell to be read is shown in FIG. 4(c), and represented by $R_i$ (i is the logic data "1" or "0"). $R_1$ and $R_0$ are the resistances of the corresponding reading head. Refr is the reference resistor between nodes c and d, and the relationship between them is $R_1$>Rrefr>$R_0$. When WL is enabled and Vread is 0 V, data will be read from (O) based on MSC.

TABLE 1

|  | Skyrmion | Logic data | $R_i/R_{ij}$ ($R_{ab}$) | Rref ($R_{cd}$) | $\overline{Qm}$ (O) |
|---|---|---|---|---|---|
| Read operation | pre | 1 | $R_1$ | Rrefr = ($R_1$ + $R_0$)/2 | 1 |
|  | abs | 0 | $R_0$ |  | 0 |
| AND/XOR (step 2) operation | (pre, pre) | (1, 1) | $R_{11}$ | Rrefa = ($R_{11}$ + $R_{10}$)/2 | 1/0 |
|  | (pre, abs) | (1, 0) | $R_{10}$ |  | 0/1 |
|  | (abs, pre) | (0, 1) | $R_{01}$ | Rrefx = ($R_{00}$ + $R_{10}$)/2 | 0/1 |
|  | (abs, abs) | (0, 0) | $R_{00}$ |  | 0/0 |

4.2. Specific Steps of XOR Operation

In the XOR operation, the relationship between the possible values of the reference resistor Rrefx and $R_{ij}$ is $R_{11}$>$R_{10}$=$R_{01}$>Rrefx>$R_{00}$. Two steps are required to obtain the XOR operation result. In step 1, the MSC performs an AND operation and transmits the output signal (O) to the mode controller (MC). In step 2, the MC outputs the control signal CS according to the signal (O) to determine whether to enable Rrefx, and then PCSA is utilized to obtain the XOR result. If (O) outputs "1" in step 1, it means that the data to be accessed is "1", the MC does not enable any reference resistor, and the nodes c and d are disconnected, and therefore (O) outputs "0" in step 2. Otherwise, if (O) outputs "0" in step 1, the MC will enable the reference resistor Rrefx, and then (O) can output XOR results of other conditions.

The above embodiments are only used to illustrate the technical solutions of the present disclosure, but not to limit them. Although the present disclosure has been described in detail with reference to the foregoing embodiments, a person of ordinary skill in the art should understand that the technical solutions described in the foregoing embodiments can be modified, or some of the technical features can be replaced with equivalents. These modifications or replacements do not cause the nature of the corresponding technical solutions to deviate from the spirit and scope of the technical solutions in the embodiments of the present disclosure.

INDUSTRIAL APPLICABILITY

The computing in-memory architecture of the disclosure is designed by utilizing the skyrmion racetrack memory, so that storage is realized in the memory, and computing operation can be carried out in the memory. Binary convolution calculation is effectively supported in the disclosure, the shift characteristic of the SRM is fully utilized, data memory access redundancy is reduced, and the problem of sparsity of BCNN is solved, thereby reducing the calculation burden, and significantly reducing power consumption. In the meantime, the disclosure provides a computing in-memory architecture based on skyrmion racetrack memory (SRM-CIM) with ultra-low power consumption for convolutional neural networks that are widely applied in the field of Internet of Things. The architecture can simultaneously perform storage operation and calculation operation (AND operation and XOR operation) in the memory. The disclosure can realize that the 2×2 kernel needs only 26.751 nJ of energy to complete a convolution scanning process on a 64×64 input, and the execution time is only 72.641 us. In the case where a typical binary convolutional neural network ratio is, for example, XNOR-Net, when the disclosure is applied to the convolutional layer, the energy consumed is reduced by 98.7% compared with the equivalent based on RRAM. Accordingly, the technical solution in the disclosure has industrial applicability.

What is claimed is:

1. A computing in-memory system based on skyrmion racetrack memory, the system comprising: a circuit architecture of computing in-memory architecture based on skyrmion racetrack memory (SRM-CIM), wherein the circuit architecture of SRM-CIM comprises a row decoder, a column decoder, a voltage-driven, a storage array, a modified sensor circuit, a counter Bit-counter and a mode controller; wherein the voltage-driven comprises two NMOSs, and drains of the two NMOSs are respectively connected with a voltage source that supplies voltage to a write operation and a read operation, a source is grounded, and a gate is connected to a 3-to-1 selector, and further comprises a wire and the two NMOSs and are connected to the 3-to-1 selector in parallel, representing that a voltage of a bit line required for the read operation, the AND operation and the XOR operation is 0; under the control of a control signal sent by the mode controller, the 3-to-1 selector selects the corresponding NMOS or wire, and supplies a driving voltage according to an operating mode;

the modified sensor circuit compares resistance between a first node to a second node and a third node to a fourth node by using a pre-charge sense amplifier; the first node and the second node are respectively connected to a bit line and a source line of the circuit, and a reference resistor is connected between the third node and the fourth node; the reference resistor requires different resistances in different operating modes, wherein, three NMOSs are respectively connected in series as first reference resistor of magnetic tunnel junction (MTJ) that supplies resistance for the read operation, second reference resistor of MTJ that supplies resistance for the XOR operation and third reference resistor of MTJ that supplies resistance for the AND operation, then the drain is connected to the third node in parallel, the source is connected to the fourth node, and the gate is connected to the 3-to-1 selector, the selector is controlled by the control signal to select the corresponding NMOS, and select the corresponding reference resistor according to the operating mode;

the storage array is composed of the skyrmion racetrack memory.

2. The computing in-memory system based on skyrmion racetrack memory according to claim 1, wherein the pre-charge sense amplifier comprises four PMOSs and two NMOSs, if a first resistance between the first node and the second node is greater than a second resistance between the third node and the fourth node, a first output terminal outputs 0 and a second output terminal outputs 1; on the contrary, if the first resistance is less than the second resistance, the first output terminal outputs 1 and the second output terminal outputs 0.

3. The computing in-memory system based on skyrmion racetrack memory according to claim 2, wherein the circuit architecture of SRM-CIM is a nano racetrack, comprising a ferromagnetic layer, a heavy metal layer, and a substrate layer;

with MTJ being written in series to the bit line and the source line through one NMOS on the racetrack, and the gate of NMOS being connected to a write word line, which is a write port, so as to control generation of skyrmion;

with MTJ being read in series to the bit line and the source line through one NMOS on the racetrack, and the gate of NMOS being connected to a read word line, which is a read port, so as to control inspection of skyrmion, wherein different resistances displayed on a MTJ reading head represent data "1" and "0" respectively;

with NMOS being connected in series to the bit line and the source line on both sides on the racetrack, and the gate of two NMOSs being connected to a shift word line, which is a shift port, so as to control movement of skyrmion.

4. A computing in-memory method based on skyrmion racetrack memory, which adopts the computing in-memory system based on skyrmion racetrack memory described in claim 3, wherein the method comprises a convolution process of a binary convolutional neural network, and specifically comprises the following steps:

an input is a m×m input matrix and a weight is a n×n weight matrix, wherein n is less than m; the weight matrix is scanned on the input matrix, and corresponding weight vector and input vector are subjected to convolution calculation;

a formula of the convolution calculation is expressed as:

$$I\&W=\text{Bit-count}(I(B)\&W(B))$$

wherein I and W are the input and weight vectors, respectively, and I(B) and W(B) are binary digits of each bit in the input and the weight, respectively.

5. A computing in-memory method based on skyrmion racetrack memory, which adopts the computing in-memory system based on skyrmion racetrack memory described in claim 2, wherein the method comprises a convolution process of a binary convolutional neural network, and specifically comprises the following steps:

an input is a m×m input matrix and a weight is a n×n weight matrix, wherein n is less than m; the weight matrix is scanned on the input matrix, and corresponding weight vector and input vector are subjected to convolution calculation;

a formula of the convolution calculation is expressed as:

$$I\&W=\text{Bit-count}(I(B)\&W(B))$$

wherein I and W are the input and weight vectors, respectively, and I(B) and W(B) are binary digits of each bit in the input and the weight, respectively.

6. The computing in-memory system based on skyrmion racetrack memory according to claim 1, wherein the storage array comprises a vertical racetrack group and a horizontal racetrack group, and the vertical racetrack group and the horizontal racetrack group are respectively composed of a skyrmion racetrack memory;

in the vertical racetrack group, the skyrmion racetrack memory is connected vertically;

in the horizontal racetrack group, the skyrmion racetrack memory is connected horizontally.

7. A computing in-memory method based on skyrmion racetrack memory, which adopts the computing in-memory system based on skyrmion racetrack memory described in claim 6, wherein the method comprises a convolution process of a binary convolutional neural network, and specifically comprises the following steps:

an input is a m×m input matrix and a weight is a n×n weight matrix, wherein n is less than m; the weight matrix is scanned on the input matrix, and corresponding weight vector and input vector are subjected to convolution calculation;

a formula of the convolution calculation is expressed as:

$$I\&W=\text{Bit-count}(I(B)\&W(B))$$

wherein I and W are the input and weight vectors, respectively, and I(B) and W(B) are binary digits of each bit in the input and the weight, respectively.

8. A computing in-memory method based on skyrmion racetrack memory, which adopts the computing in-memory system based on skyrmion racetrack memory described in claim 1, wherein the method comprises a convolution process of a binary convolutional neural network, and specifically comprises the following steps:

an input is a m×m input matrix and a weight is a n×n weight matrix, wherein n is less than m; the weight matrix is scanned on the input matrix, and corresponding weight vector and input vector are subjected to convolution calculation;

a formula of the convolution calculation is expressed as:

$$I\&W=\text{Bit-count}(I(B)\&W(B))$$

wherein I and W are the input and weight vectors, respectively, and I(B) and W(B) are binary digits of each bit in the input and the weight, respectively.

9. The computing in-memory method based on skyrmion racetrack memory according to claim 8, wherein the method further comprises a shift method for the convolution process of the binary convolutional neural network, which specifically comprises:

if the weight of n×n is scanned on the input of m×m, a step size is 1, then

S1. a weight data and an input data are stored in a storage array in an original order, the input is stored in a horizontal racetrack group, and the weight is stored in a vertical racetrack group;

S2. the weight and the corresponding input are subjected to a convolution calculation;

S3. the weight is moved to the right by 1 unit of length, and is subjected to the convolution calculation along with the corresponding input;

S4. step S3 is repeated for $\left[\frac{m}{l}\right] - 1$ times;

S5. the input is moved upward by 1 unit of length, and the weight is moved to an initial position on the left;
S6. steps S2, S3 and S4 are repeated;
S7. steps S5 and S6 are repeated for $\left[\frac{m}{l}\right] - 2$ times.

10. The computing in-memory method based on skyrmion racetrack memory according to claim 8, wherein the method further comprises a step of writing a vector in the convolution process of the binary convolutional neural network, wherein
a write word line is enabled, and a positive voltage is set between a bit line and a source line, "1" is written on a racetrack of a writing head; if data "0" is to be written, no operation is required;
shift word lines are enabled, and a positive voltage is set between the bit line and the source line, the data just written is moved down to the next unit, and the next data is continuously written in the writing head.

11. The computing in-memory method based on skyrmion racetrack memory according to claim 10, wherein the method comprises a read operation, wherein
if the data stored in a reading head is 1, a resistance of the reading head is represented by $R_1$; otherwise, the data stored in the reading head is 0, and the resistance of the reading head is represented by $R_0$; the first reference resistor is represented by Rrefr, $R_1 > Rrefr > R_0$;
when a word line is enabled and a voltage of the read operation is 0 V, data will be read from a second output terminal based on the modified sensor circuit.

12. The computing in-memory method based on skyrmion racetrack memory according to claim 10, wherein the method further comprises an XOR operation, wherein
in the XOR operation, two resistances in the same column is represented by $R_i$ and $R_j$ respectively, a resistance of $R_i$ connected in parallel with $R_j$ is represented by $R_{ij}$, i and j are logic data "1" and "0" respectively, the second reference resistor is represented by Rrefx, and a relationship between the second reference resistor Rrefx and $R_{ij}$ is $R_{11} > R_{10} = R_{01} > Rrefx > R_{00}$;
two steps are required to obtain an XOR operation result:
step 1, the modified sensor circuit performs an AND operation, and transmits an output signal "0" to the mode controller;
step 2, the mode controller outputs a control signal according to the signal "0" to determine whether to enable the second reference resistor, and then use the pre-charge sense amplifier to obtain the XOR result;
if a second output terminal outputs "1" in the step 1, it means that the data to be accessed is "1", and the mode controller does not enable any reference resistor to disconnect the third node and the fourth node, and therefore the second output terminal outputs "0" in the step 2, otherwise, if the second output terminal outputs "0" in the step 1, the mode controller will enable the second reference resistor, and then the second output terminal will output the XOR results of other conditions.

* * * * *